United States Patent
Blalock et al.

[11] Patent Number: 6,095,159
[45] Date of Patent: Aug. 1, 2000

[54] METHOD OF MODIFYING AN RF CIRCUIT OF A PLASMA CHAMBER TO INCREASE CHAMBER LIFE AND PROCESS CAPABILITIES

[75] Inventors: Guy Blalock; Kevin G. Donohoe, both of Boise, Id.

[73] Assignee: Micron Technology, Inc., Boise, Id.

[21] Appl. No.: 09/012,155

[22] Filed: Jan. 22, 1998

[51] Int. Cl.[7] .................................................. H05H 1/00
[52] U.S. Cl. ......................... 134/1.1; 438/905; 156/345; 118/723 I; 118/723 IR; 315/111.51
[58] Field of Search ...................... 156/345; 118/723 E, 118/723 I, 723 IR; 204/298.34; 438/905; 134/1.1; 315/111.21, 111.51

[56] References Cited

U.S. PATENT DOCUMENTS

| | | | |
|---|---|---|---|
| 5,280,154 | 1/1994 | Cuomo et al. | 156/345 |
| 5,362,526 | 11/1994 | Wang et al. | 427/573 |
| 5,458,732 | 10/1995 | Butler et al. | 216/61 |
| 5,473,291 | 12/1995 | Brounley | 333/17.3 |
| 5,507,874 | 4/1996 | Su et al. | 118/723 R |
| 5,756,400 | 5/1998 | Ye et al. | 438/905 |
| 5,772,832 | 6/1998 | Collins et al. | 156/345 |
| 5,942,855 | 8/1999 | Hopwood | 118/723 I |

OTHER PUBLICATIONS

S. M. Rossnagel et al., Metal Ion Deposition From Ionized Mangetron Sputtering Discharge, J. Vac Sci Technol. B 12(1), Jan./Feb. 1994, pp. 449–453, Yorktown Heights, New York.

*Primary Examiner*—Thi Dang
*Attorney, Agent, or Firm*—Thorp Reed & Armstrong

[57] ABSTRACT

A method for controlling the voltage distribution of the standing wave impressed upon the coil of an inductively coupled plasma generator includes the steps of impressing a radio frequency voltage across the coil to establish a standing wave thereacross. A voltage profile is selected for the standing wave so as to control the location and amount of capacitive coupling. A circuit parameter is controlled to achieve the selected voltage profile. Proper selection of the voltage profile enhances process capabilities, decreases the time between cleans, minimizes component wear, and minimizes cleaning time. An apparatus for carrying out the disclosed method is also disclosed.

24 Claims, 2 Drawing Sheets

METHOD OF MODIFYING AN RF CIRCUIT OF A PLASMA CHAMBER TO INCREASE CHAMBER LIFE AND PROCESS CAPABILITIES

BACKGROUND OF THE INVENTION

1. Field of the Invention

The present invention is directed generally to plasma processing chambers and, more particularly, to inductively coupled processing chambers.

2. Description of the Background

Plasma processing chambers are used in a number of different industries. For example, plasma processing chambers are used in the fabrication of integrated circuits, for coating medical devices, and for coating mirrors. Plasma processing chambers may be either inductively coupled or capacitively coupled. In the capacitively coupled systems, electrodes comprised of parallel plates are energized to produce the plasma. In the inductively coupled systems, an inductive coil is energized to produce the plasma. In both systems, varying the parameters of the mechanism used to generate the plasma provides some ability to control the characteristics of the generated plasma.

For example, in inductively coupled systems, the coil has a time varying radio frequency voltage impressed thereupon. The electron heating zone in the inductively coupled plasma is shaped like a torroid whose diameter is affected by the coil geometry. The value of the capacitor between the coil and ground may also effect the size and location of the electron heating zone.

In the semiconductor industry, a plasma chamber may be used to carry out a variety of processes such as etching, deposition, sputtering, and annealing. Many of those processes leave contaminant depositions throughout the processing chamber. Such contaminants may adversely impact the process step being performed which, in turn, can adversely impact device yield. The adverse impact on device yield becomes more pronounced as device size decreases.

Another problem is the wear out of the dielectric parts (the plate) within the processing chamber. Wear out of the plate is a particular problem when the chamber is used for etching. For example, an etching process can result in the deposition of a polymer on the plate. A cleaning step is required to remove that polymer. The efficacy of the cleaning step depends on a number of parameters, one of which is the value of the capacitive coupling between the coil and plasma. That capacitive coupling is defined by a voltage standing wave present on the inductive coil while powered. The higher the voltage, the greater the capacitive coupling. The cleaning efficacy at different radial and azimuthal locations on the parts varies with the value of the capacitive coupling. Also, the wear out of the plate is concentrated in one location determined by the value of the capacitive coupling.

Because of the need to keep expensive process equipment such as plasma chambers in service, it is desirable to operate the plasma chamber in a way which improves process capability, minimizes part wear, reduces time between cleans, and minimizes cleaning time. Thus, the need exists for a method and apparatus which achieves those goals.

SUMMARY OF THE INVENTION

The present invention solves the problems encountered in the prior art by controlling the voltage distribution of the standing wave impressed upon the coil, thereby controlling the location and amount of capacitive coupling. In the presently preferred embodiment, that is accomplished by controlling the value of the capacitor in the RF circuit between the coil and ground. Controlling the value of the coil to ground capacitor during an etching step controls the location of the deposit that occurs during an etching process. The capacitor can be fixed at an optimal value or varied from the beginning of the etch process (where the capacitor's value may be less important) to the end (where the capacitor's value can be very important). That permits the more critical end of the etch to occur in an optimally shaped electron heating zone and in a chamber that has an optimal deposition pattern of the polymer resulting from the capacitor value during the early portion of the step.

The invention also contemplates changing the value of the capacitor from the etch to the clean step and changing the value of the capacitor during the clean step. Changing the value of the capacitor during the clean step makes that step more efficient and eliminates the concentration of wear in one place. The value of the coil to ground capacitor may be changed stepwise or continuously during the etch step or the clean step.

More broadly, the present invention is directed to a method comprised of the steps of:

impressing a radio frequency voltage across a coil to establish a standing wave thereacross;

selecting a voltage profile for the standing wave so as to achieve optional capacitive coupling of at at least one predetermined position across the coil; and controlling a circuit parameter, such as the value of a capacitor or inductor, to achieve the selected voltage profile.

An apparatus for carrying out the method is also disclosed. By controlling the voltage distribution of the standing wave, process capabilities are enhanced, the time between cleans is maximized, component wear is minimized, and cleaning time is minimized. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
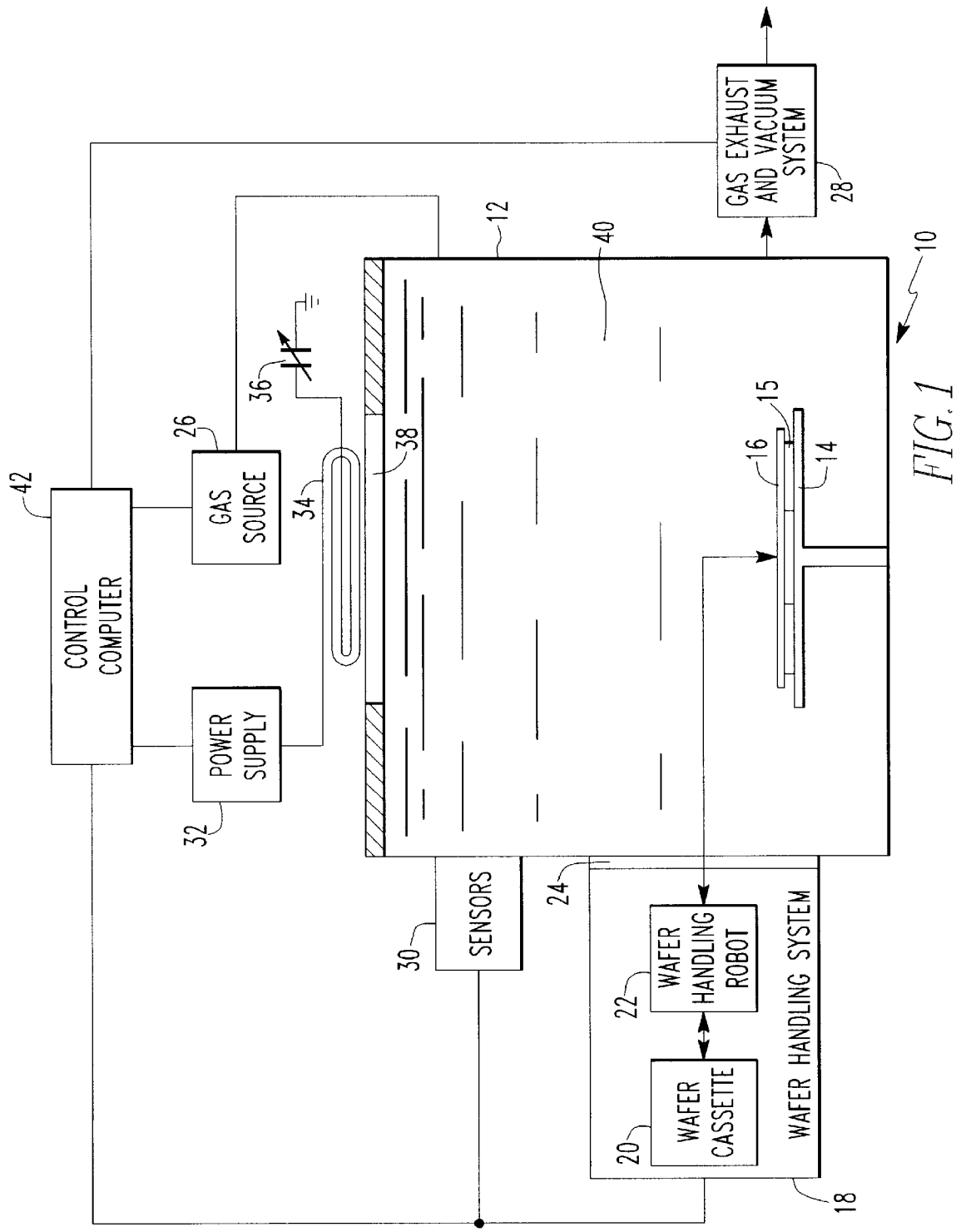
FIG. 1 is a diagram illustrating certain of the components of a plasma processing apparatus with which the present invention may be used.

FIG. 1 illustrates a plasma processing apparatus 10 with which the present invention may be used. It is to be understood that the apparatus 10 has been simplified to illustrate only those components which are relevant to an understanding of the present invention. Those of ordinary skill in the art will recognize that other components are required to produce an operational processing apparatus 10. However, because such components are well known in the art, and because they do not further aid in the understanding of the present invention, a discussion of such components is not provided.

In FIG. 1, the apparatus 10 may be comprised of a cold wall reaction chamber 12 constructed of aluminum. The bottom and sides of the reaction chamber 12 may be lined with quartz to protect the walls from film deposition during the processing steps. The walls of the chamber 12 may be cooled by a circulating water jacket (not shown) in conjunction with a heat exchanger (not shown). The walls are typically maintained at or above 100° C., because lower temperatures may induce the deposition of films on the walls of the reaction chamber 12. Such depositions can be undesirable because they remove etchant from the plasma and result in material which must be eventually cleaned from the surface to maintain productivity of the chamber. Such depositions may cause temperature gradients which adversely affect the processing steps and alter the stability of processing chemistries. Furthermore, depositions on walls may flake and produce particulate that can contaminate a wafer in the chamber 12.

A wafer support table 14 or the like is located near the bottom of the chamber 12, and is used for supporting a wafer 16. The support table 14 is a flat surface, typically having three or more vertical support pins 15 with low thermal mass.

A wafer handling system 18 is adjacent to the chamber 12, and includes a wafer cassette 20 and a wafer handling robot 22. The wafer cassette 20 holds a plurality of wafers, and the wafer handling robot 22 transports one wafer at a time from the wafer cassette 20 to the wafer support table 14, and back again. A door 24 isolates the wafer handling system 18 from the chamber 12 when the wafers are not being transported to and from the wafer support table 14.

A gas source 26 is in fluid communication with the chamber 12. More than one type of gas may be available from gas source 26, and gases may be provided individually or in combination. The gases may, for example, be used to deposit films on the wafer 16, flush gases from the chamber 12, or cool the chamber 12 and the wafer 16.

Gases are removed from the chamber 12, and a vacuum may be created within the chamber 12, by a gas exhaust and vacuum system 28, as is well known in the art. Also present are sensors 30, such as a pyrometer, which are used to measure process parameters.

A power supply 32 supplies power to a coil 34 connected to ground through a variable capacitor 36. The coil 34 is a flat spiral coil that is positioned proximate to a window 38 in the chamber 12. The position of the coil 34 and the material comprising the window 38 are selected as is known in the art such that RF energy produced by the coil 34 is efficiently coupled to the gases in the chamber 12 to produce a plasma 40.

The electron heating zone in the inductively coupled plasma 40 is shaped like a torroid whose diameter is effected by the coil's 34 geometry. The size of the heating zone and its location relative to the wafer have important effects on the process results. In addition, the deposition thickness of polymer on the window 38 varies with radial and azimuthal position in a way that depends on the value of the capacitor 36.

Completing the description of FIG. 1, a control computer 42 controls the various components which comprise the plasma processing apparatus 10.

Figure 2:
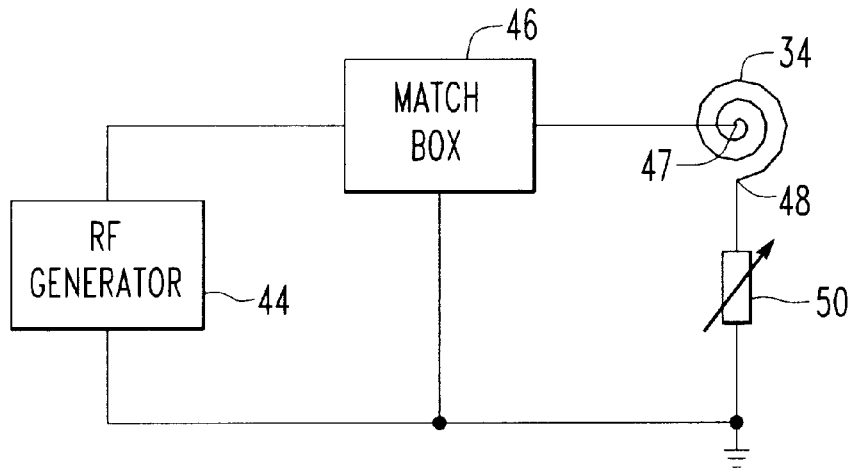
FIG. 2 is an electrical schematic illustrating the apparatus of the present invention.

In FIG. 2, an electrical schematic illustrating the apparatus of the present invention is illustrated. The power supply 32 of FIG. 1 is illustrated in FIG. 2 as an RF generator 44. The RF generator 44 supplies power to the coil 34 through a matchbox circuit 46. The matchbox circuit 46 is known in the art and is used for impedance matching to ensure maximum coupling of power from the RF generator 44 to the coil 34. As seen in FIG. 2, the coil 34 is connected at a first end 47 to the RF generator 44 through the matchbox circuit 46 and is connected at a second end 48 to ground through a variable component 50. In the preferred embodiment of the present invention, the variable component 50 may be the variable capacitor 36 as shown in FIG. 1.

In operation, the RF generator 44 is used to impress a radio frequency voltage across the coil 34. As is known in the art, that causes a standing wave to be created across the coil 34. By graphing the magnitude of the voltage as a function of coil length, a voltage profile can be generated. By varying the value of the variable component 50, that voltage profile can be varied. The advantage of varying the voltage profile is that it varies where the point or points of maximum or minimum voltage appear across the coil 34. The points of maximum voltage correspond to areas of maximum capacitive coupling to the plasma whereas the points of minimum voltage correspond to areas of minimum capacitive coupling to the plasma. "Capacitive coupling to the plasma" refers to the region under the coil in the plasma where the voltage on the coil is high enough to cause capacitive etching. That is etching with a sputter component. That is the type of etching that is most efficient to keep a surface clean. By varying these areas of maximum and minimum coupling to the plasma, various desirable characteristics can be obtained as described more fully hereinbelow.

Figure 3:
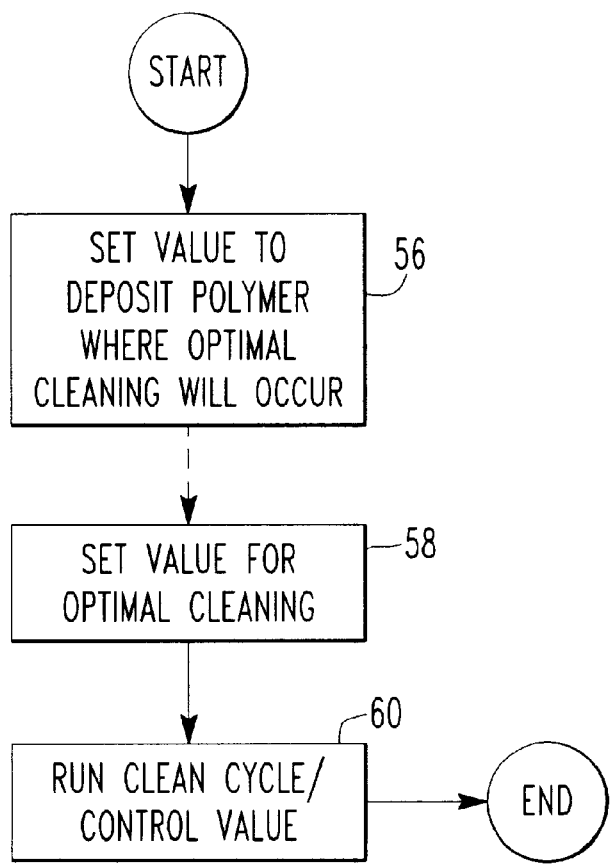
FIG. 3 is a flow chart illustrating the steps of the method of the present invention.

FIG. 3 is a flowchart illustrating the steps of the method of the present invention. One aspect of the present invention is illustrated by block 56. Block 56 represents the step in the process wherein the value of the variable component 50 is selected so that contaminant polymer depositions will be deposited on window 38 in locations wherein it will be the easiest to clean with subsequent cleaning steps. Thereafter, the apparatus 10 is used for its desired purpose.

Step 56 also contemplates that the value of the variable component 50 may be changed during the process step. For example, the value of the variable component 50 may be fixed at a first value during the beginning of a process such as an etch process. The value of the variable component 50 may be selected so as to produce a desirable deposition pattern. Thereafter, later in the etch process, the value of the variable component 50 may be changed so as to produce an optimally shaped electron heating zone in the chamber 12 that has an optimal deposition pattern of the polymer resulting from the earlier value of the variable component 50.

The present invention also contemplates changing the value of the variable component 50 from the process step to the clean step as shown by block 58 in FIG. 3. According to that aspect of the present invention, the voltage profile of the standing wave impressed upon the coil 34 is adjusted so as to locate regions of maximum capacitive coupling proximate to those regions of the window 38 which require the most cleaning. Thereafter, the clean cycle is run at step 60.

The present invention also contemplates changing the value of the variable component 50 during the clean step. That is, after the contaminant polymer begins to be removed from the window 38, it will be removed first from those areas having maximum capacitive coupling. After those areas are clean, it is desirable to relocate the area of maximum capacitive coupling to those portions of the window 38 which are not yet clean. That may be accomplished by either continually varying the value of the variable component 50 or varying the value of the variable component 50 in a stepwise manner.

By controlling the voltage distribution of the standing wave, process capabilities are enhanced, the time between cleanings is maximized, component wear is minimized, and the cleaning time is minimized as discussed above.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A method, comprising:
   impressing a radio frequency voltage across a coil to establish a standing wave thereacross;
   selecting at least one point along the length of the coil where a peak voltage is to occur so as to control the location and amount of capacitive coupling; and
   controlling a circuit parameter to achieve a voltage peak at said selected point.

2. The method of claim 1 wherein said step of controlling a circuit parameter includes the step of controlling the value of one of a capacitor and an inductor connected between an end of the coil and ground.

3. The method of claim 1 wherein said selecting step includes the step of selecting at least one point so as to achieve maximum capacitive coupling at a point where a maximum amount of material removal is desired.

4. A method of controlling the voltage impressed across an inductive coil of a plasma chamber during processing of items to optimize cleaning efficiency during a subsequent cleaning cycle, comprising:
   impressing a radio frequency voltage across a coil to establish a standing wave thereacross;
   selecting at least one point along the length of the coil where a peak voltage is to occur so as to achieve optimum polymer deposition during processing of an item at a location where cleaning can be achieved most efficiently; and
   controlling a circuit parameter to achieve a voltage peak at said selected point.

5. The method of claim 4 wherein said step of controlling a circuit parameter includes the step of controlling the value of one of a capacitor and an inductor connected between an end of the coil and ground.

6. The method of claim 4 wherein the processing of items includes performing an etch step on solid state devices.

7. The method of claim 4 wherein the processing of items includes performing a deposition step on solid state devices.

8. The method of claim 4 wherein said point selected for the processing of items is different from the point selected during the subsequent cleaning cycle.

9. A method of controlling the voltage impressed across an inductive coil of a plasma chamber during a cleaning cycle, comprising:
   impressing a radio frequency voltage across a coil to establish a standing wave thereacross;
   selecting at least one point along the length of the coil where a peak voltage is to occur so as to control a location where maximum cleaning is to occur; and
   controlling a circuit parameter to achieve a voltage peak at said selected point.

10. The method of claim 9 additionally comprising the step of varying the selected point during the cleaning cycle.

11. The method of claim 10 wherein said step of varying the selected point includes the step of varying the selected point in a stepwise manner.

12. The method of claim 10 wherein said step of varying the selected point includes the step of varying the selected point in a continuous manner.

13. The method of claim 9 wherein said step of controlling a circuit parameter includes the step of controlling the value of one of a capacitor and an inductor connected between an end of the coil and ground.

14. A method of controlling the voltage impressed across an inductive coil of a plasma chamber during a cleaning cycle, comprising:
   impressing a radio frequency voltage across a coil to establish a standing wave thereacross;
   selecting a voltage profile for said standing wave so as to control a location where maximum cleaning is to occur;
   varying the selected voltage profile during the cleaning cycle; and
   controlling a circuit parameter to achieve said voltage profile.

15. The method of claim 14 wherein said step of varying the voltage profile includes the step of varying the voltage profile in a stepwise manner.

16. The method of claim 14 wherein said step of varying the voltage profile includes the step of varying the voltage profile in a continuous manner.

17. An apparatus, comprising:
   a radio frequency generator;
   a coil having a first end connected to said radio frequency generator and a second end;
   a component having an adjustable value, said component connected between said second end of said coil and ground; and
   a control computer for adjusting the value of said component to enable the variation of a voltage profile versus coil length for a standing wave set up across said coil by said generator.

18. The apparatus of claim 14 wherein said component includes a variable capacitor.

19. The apparatus of claim 14 wherein said component includes a variable inductor.

20. The apparatus of claim 14 additionally comprising a matching circuit connected between said generator and said first end of said coil.

21. A plasma processing apparatus, comprising:
   a chamber;
   a gas handling system servicing said chamber;
   a wafer handling system servicing said chamber;
   a radio frequency generator;
   a coil having a first end connected to said radio frequency generator and a second end, said coil being located so as to radiate energy into said chamber and generate a plasma;
   a component having an adjustable value, said component connected between said second end of said coil and ground; and
   a control computer for adjusting the value of said component to vary the position of the peak values of a standing wave impressed along said coil.

22. The apparatus of claim 18 wherein said component includes a variable capacitor.

23. The apparatus of claim 18 wherein said component includes a variable inductor.

24. The apparatus of claim 18 additionally comprising a matching circuit connected between said generator and said coil.

* * * * *